US011170135B2

(12) United States Patent
Chen

(10) Patent No.: US 11,170,135 B2
(45) Date of Patent: Nov. 9, 2021

(54) METHOD, APPARATUS, AND DEVICE FOR GENERATING A VISUAL MODEL LAYOUT OF A SPACE

(71) Applicant: Siemens Aktiengesellschaft, Munich (DE)

(72) Inventor: Xue Chen, Shanghai (CN)

(73) Assignee: Siemens Aktiengesellschaft, Munich (DE)

( * ) Notice: Subject to any disclaimer, the term of this patent is extended or adjusted under 35 U.S.C. 154(b) by 526 days.

(21) Appl. No.: 16/034,433

(22) Filed: Jul. 13, 2018

(65) Prior Publication Data

US 2019/0065631 A1 Feb. 28, 2019

(30) Foreign Application Priority Data

Aug. 31, 2017 (CN) .......................... 201710773348.8

(51) Int. Cl.
*G06F 30/13* (2020.01)
*G06T 17/00* (2006.01)
*G06T 11/20* (2006.01)

(52) U.S. Cl.
CPC ............ *G06F 30/13* (2020.01); *G06T 11/206* (2013.01); *G06T 17/00* (2013.01)

(58) Field of Classification Search
CPC ......... G06F 30/13; G06F 30/00; G06T 17/00; G06T 11/206
See application file for complete search history.

(56) References Cited

U.S. PATENT DOCUMENTS

2016/0092101 A1 3/2016 Arinobu
2018/0032647 A1* 2/2018 Wright ................... G06F 30/13

FOREIGN PATENT DOCUMENTS

EP 2110762 A1 10/2009
JP 2001117958 A 4/2001
(Continued)

OTHER PUBLICATIONS

Peter Lorenz and Thomas Schulze. 1995. Layout based model generation. In Proceedings of the 27th conference on Winter simulation (WSC '95). IEEE Computer Society, USA, 728-735. DOI:https://doi.org/10.1145/224401.224719. (Year: 1995).*

(Continued)

*Primary Examiner* — Saif A Alhija

(74) *Attorney, Agent, or Firm* — Harness, Dickey & Pierce, P.L.C.

(57) ABSTRACT

A method is for generating a visual model layout of a space. An embodiment of the method includes obtaining station layout information and station description information that correspond to the space; based on the station layout information and the station description information, determining station attribute information respectively corresponding to each station of the at least one station; respectively determining code information and model templates of the stations according to the station attribute information of the stations; and based on the code information and the model templates that correspond to the stations, drawing model images corresponding to the stations to generate a visual model layout corresponding to the space. Advantages of embodiments include: a factory model layout is automatically generated, thereby greatly saving time and energy when a model layout of space is planned; and an original layout diagram of a factory can be more conveniently changed and modified.

14 Claims, 7 Drawing Sheets

(56) References Cited

FOREIGN PATENT DOCUMENTS

JP        2007109213 A     4/2007
JP        2016071612 A     5/2016

OTHER PUBLICATIONS

Japanese Office Action and English translation thereof dated Jul. 29, 2019.
Lorenz P. et al: "Layout Based Model Generation"; Proceedings of the 1995 Winter Simulation Conference, 1996, pp. 728-735, XP055537540; 1996.
Extended European Search Report dated Jan. 8, 2019.

\* cited by examiner

METHOD, APPARATUS, AND DEVICE FOR GENERATING A VISUAL MODEL LAYOUT OF A SPACE

PRIORITY STATEMENT

The present application hereby claims priority under 35 U.S.C. § 119 to Chinese patent application number CN 201710773348.8 filed Aug. 31, 2017, the entire contents of which are hereby incorporated herein by reference.

FIELD

At least one embodiment of the present invention generally relates to the field of digital factories, and more particularly to a method, apparatus, and device for generating a visual model layout of a space.

BACKGROUND

Currently, digital factories are becoming more and more common in the industry, and establishing a virtual model of a production line is an important step in a digital factory.

In the prior art, in order to obtain a 2D or 3D model consistent with an actual scenario, usually one of two methods is adopted: one is by dragging station icons or 3D models correspondingly representing each station in a production line; the other is by writing an appropriate script. In order to conform to an actual scenario, it is required to calculate the exact positions (for example, x and y coordinates) of each production line station based on a layout document (typically a 2D CAD or computer-aided design layout diagram) of the production line; this process is very complicated.

All of the aforementioned operations, including dragging, programming, and coordinate calculations, are very time-consuming and labor-intensive, especially for large production lines. However, such mechanical and repetitive work currently occupies much of the R&D time of engineers.

First, engineers need to learn how to operate appropriate software, or to learn the programming language of the software, and therefore a lot of learning time is required; second, usually an initial 2D CAD layout diagram is not a final version. Therefore, when the layout diagram changes, the layout diagram and the model layout information of the production line need to be modified separately, which results in a waste of a lot of time and effort.

SUMMARY

In view of this, one of the problems solved by an embodiment of the present invention is how to automatically generate a visual model layout of a space, thereby reducing repetitive or mechanical labor.

According to an embodiment of the present invention, a method for generating a visual model layout of a space is provided, wherein the method comprises:
  obtaining station layout information and station description information that correspond to the space, the space comprising at least one station;
  based on the station layout information and the station description information, determining station attribute information respectively corresponding to each station of the at least one station;
  respectively determining code information and model templates of the stations according to the station attribute information of the stations; and
  based on the code information and the model templates that correspond to the stations, drawing model images corresponding to the stations to generate a visual model layout corresponding to the space.

According to still another embodiment of the present invention, a model generation apparatus for generating a visual model layout of a space is provided, wherein the model generation apparatus comprises:
  a first obtaining unit, configured to obtain station layout information and station description information that correspond to the space, wherein the space comprises at least one station;
  a first determining unit, configured to, based on the station layout information and the station description information, determine station attribute information respectively corresponding to each station of the at least one station;
  a second determining unit, configured to respectively determine code information and model templates of the stations according to the station attribute information of the stations; and
  a first generation unit, configured to, based on the code information and the model templates that correspond to the stations, draw model images corresponding to the stations to generate a visual model layout corresponding to the space.

According to still another embodiment of the present invention, a computer device is further provided, the computer device comprising the model generation apparatus.

According to still another embodiment of the present invention, a computer-readable medium storing executable instructions thereon is provided, characterized in that, when the executable instructions are executed, the method is performed.

BRIEF DESCRIPTION OF THE DRAWINGS

Other features, characteristics, advantages and benefits of embodiments of the present invention will become more apparent from the following detailed description in combination with the attached drawings.

LIST OF LABELING NUMERALS

Figure 1:
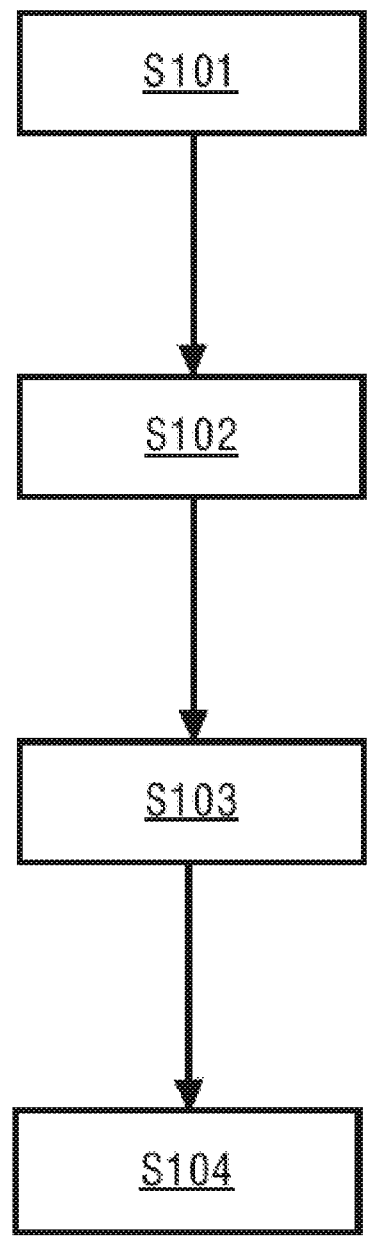
FIG. 1 is a schematic flowchart of a method for generating a visual model layout of a space according to an embodiment of the present invention.

| 100 | Model generation apparatus | 101 | First obtaining unit |
|---|---|---|---|
| 102 | First determining unit | 103 | Second determining unit |

-continued

| 103 | First generation unit | 110 | Memory |
| --- | --- | --- | --- |
| 120 | Processor | | |

DETAILED DESCRIPTION OF EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

According to an embodiment of the present invention, a method for generating a visual model layout of a space is provided, wherein the method comprises:

obtaining station layout information and station description information that correspond to the space, the space comprising at least one station;

based on the station layout information and the station description information, determining station attribute information respectively corresponding to each station of the at least one station;

respectively determining code information and model templates of the stations according to the station attribute information of the stations; and based on the code information and the model templates that correspond to the stations, drawing model images corresponding to the stations to generate a visual model layout corresponding to the space.

According to the solution of at least one embodiment, by simply importing station layout information and station description information corresponding to a space, code information and model templates corresponding to each station can be automatically determined, and then a final visual model layout is generated. In this process, a user or an engineer is not required to specifically grasp or learn the programming language corresponding to the code information, and this saves learning time and efforts that the user needs to invest in the early stage. In addition, this lowers the threshold of the implementation process for the user so that it can be used more widely. The space can, in particular, be a workshop of a factory.

According to an embodiment of the present invention, the step of drawing model images further comprises:

based on the code information corresponding to the stations of the at least one station of the space, generating a script corresponding to the space; and executing the script to determine a drawing attribute for adjusting a template model by using parameter values in the code information of the stations in the script, to determine, based on the drawing attribute, the model image corresponding to the stations.

According to the solution of at least one embodiment, code information corresponding to each station can be used to generate and execute a script, thereby obtaining a corresponding model image and realizing the automation of the model image drawing. On this basis, various additions, deletions, and other editing operations on model images can be easily and automatically achieved, greatly improving work efficiency.

According to an embodiment of the present invention, the step of determining code information further comprises:

based on station attribute information of the stations, querying a code library to obtain a corresponding source code segment; and assigning values to parameters in the source code segment based on the station attribute information of the stations, to obtain the code information corresponding to the stations.

According to the solution of at least one embodiment, by simply pre-storing a source code segment related to each attribute of a station in a code library, retrieval can be performed by attribute information and the corresponding source code segment is obtained; then, values are assigned to the parameters in the source code segment to obtain code information corresponding to a specific station, without the need of manually writing corresponding codes for each station, which greatly saves manpower and time.

According to an embodiment of the present invention, the step of determining model templates of the stations further comprises:

based on the station attribute information of the stations, querying a model library to obtain the model templates of the stations.

According to the solution of at least one embodiment, the images corresponding to each station also have a corresponding template. For the same type of stations, the same template can be provided, and drawing attributes including the position of the drawing of the template are determined on the basis of the attribute information of the station itself, eliminating the need to manually drag or adjust model images. This also improves the efficiency of operation and saves manpower and time.

According to an embodiment of the present invention, the method further comprises:

obtaining a staff arrangement document corresponding to the space, wherein the step of determining station attribute information further comprises:

determine the station attribute information of the stations according to the station layout information, the station description information, and the staff arrangement information.

According to the solution of at least one embodiment, staff arrangement information can be embodied in a visual model layout, and the richness of the information contained therein can be further improved to meet a wider variety of user requirements.

According to an embodiment of the present invention, the method further comprises:

receiving operation information of a user on the visual model layout; and based on the operation information, updating the visual model layout.

According to the solution of at least one embodiment, a user can conveniently edit and operate a visual model layout, which greatly improves the efficiency of the change operation.

According to an embodiment of the present invention, the method further comprises the following steps:

based on the updated visual model layout, generating new station layout information corresponding to the space.

According to the solution of at least one embodiment, new station layout information can be further generated on the basis of an updated visual model layout, so that subsequent operations related to the station layout information of the space can be conveniently updated. For example, when a visual layout model needs to be generated again, it can be directly generated on the basis of new station layout information, without repeating editing operations on the visual layout model generated on the basis of the old station layout information.

According to still another embodiment of the present invention, a model generation apparatus for generating a visual model layout of a space is provided, wherein the model generation apparatus comprises:

a first obtaining unit, configured to obtain station layout information and station description information that correspond to the space, wherein the space comprises at least one station;

a first determining unit, configured to, based on the station layout information and the station description information, determine station attribute information respectively corresponding to each station of the at least one station;

a second determining unit, configured to respectively determine code information and model templates of the stations according to the station attribute information of the stations; and a first generation unit, configured to, based on the code information and the model templates that correspond to the stations, draw model images corresponding to the stations to generate a visual model layout corresponding to the space.

According to the solution of at least one embodiment, by simply importing station layout information and station description information corresponding to a space, code information and model templates corresponding to each station can be automatically determined, and then a final visual model layout is generated. In this process, a user or an engineer is not required to specifically grasp or learn the programming language corresponding to the code information, and this saves learning time and effort that the user needs to invest in the early stage. In addition, this lowers the threshold of the implementation process for the user so that it can be used more widely.

According to an embodiment of the present invention, the first generating unit further comprises:

a first generation sub-unit, configured to, based on the code information corresponding to the stations of the at least one station of the space, generate a script corresponding to the space; and a second generation sub-unit, configured to execute the script to determine a drawing attribute for adjusting a template model by using parameter values in the code information of the stations in the script, to determine, based on the drawing attribute, the model image corresponding to the stations.

According to the solution of at least one embodiment, code information corresponding to each station can be used to generate and execute a script, thereby obtaining a corresponding model image and realizing the automation of the model image drawing. On this basis, various additions, deletions, and other editing operations on model images can be easily and automatically achieved, greatly improving work efficiency.

According to an embodiment of the present invention, the second determining unit further comprises:

a first querying unit, configured to, based on station attribute information of the stations, query a code library to obtain a corresponding source code segment; and a second obtaining unit, configured to assign values to parameters in the source code segment based on the station attribute information of the stations, to obtain the code information corresponding to the stations.

According to the solution of at least one embodiment, by simply pre-storing a source code segment related to each attribute of a station in a code library, retrieval can be performed by attribute information and the corresponding source code segment is obtained; then, values are assigned to the parameters in the source code segment to obtain code information corresponding to a specific station, without the need of manually writing corresponding codes for each station, which greatly saves manpower and time.

According to an embodiment of the present invention, the second determining unit further comprises:

a second querying unit, configured to, based on the station attribute information of the stations, query a model library to obtain the model templates of the stations.

According to the solution of at least one embodiment, the images corresponding to each station also have a corresponding template. For the same type of stations, the same template can be provided, and drawing attributes including the position of the drawing of the template are determined on the basis of the attribute information of the station itself, eliminating the need to manually drag or adjust model images. This also improves the efficiency of operation and saves manpower and time.

According to an embodiment of the present invention, the model generation apparatus further comprises:
a third obtaining unit, configured to obtain a staff arrangement document corresponding to the space, wherein
the first determining unit is further configured to:
determine the station attribute information of the stations according to the station layout information, the station description information, and the staff arrangement information.

According to the solution of at least one embodiment, staff arrangement information can be embodied in a visual model layout, and the richness of the information contained therein can be further improved to meet a wider variety of user requirements.

According to an embodiment of the present invention, the model generation apparatus further comprises:
a receiving unit, configured to receive operation information of a user on the visual model layout; and
an update unit, configured to, based on the operation information, update the visual model layout.

According to the solution of at least one embodiment, a user can conveniently edit and operate a visual model layout, which greatly improves the efficiency of the change operation.

According to an embodiment of the present invention, the model generation apparatus further comprises:
a second generation unit, configured to, based on the updated visual model layout, generate new station layout information corresponding to the space.

According to the solution of at least one embodiment, new station layout information can be further generated on the basis of an updated visual model layout, so that subsequent operations related to the station layout information of the space can be conveniently updated. For example, when a visual layout model needs to be generated again, it can be directly generated on the basis of new station layout information, without repeating editing operations on the visual layout model generated on the basis of the old station layout information.

It should be noted that not all the steps and modules in the foregoing processes and the various structural diagrams are necessary, and some steps or modules may be omitted according to actual needs. The order of execution of each step is not fixed and can be adjusted as needed. Each module is functionally divided only for convenience of description. In actual implementation, one module can be implemented by multiple modules, and the functions of multiple modules can also be implemented by the same module. These modules can be located in the same apparatus and can also be located in different apparatuses.

According to still another embodiment of the present invention, a computer device is further provided, the computer device comprising the model generation apparatus.

According to still another embodiment of the present invention, a computer-readable medium storing executable instructions thereon is provided, characterized in that, when the executable instructions are executed, the method is performed.

Compared with the prior art, at least one embodiment of the present invention has at least one of the following advantages: according to a method of an embodiment of the present invention, automatic generation of a factory model layout is achieved, the time and effort required for planning the model layout of a space are greatly reduced, and an engineer does not need to learn a new programming language and thus can spare more time for creative work. In addition, according to at least one embodiment of the present invention, a 2D layout diagram can be directly generated on the basis of a modified 3D model layout without separate modifications, so that the original layout map of the factory can be changed and modified more conveniently.

Example embodiments of the present disclosure will be described in more detail below with reference to the attached drawings. Although example embodiments of the present disclosure are shown in the attached drawings, it should be understood that the present disclosure may be implemented in various forms and should not be limited to the embodiments set forth herein. On the contrary, these embodiments are provided so that this disclosure will be thorough and complete, and the scope of the present disclosure can be fully conveyed to those of ordinary skill in the art.

Figure 2:
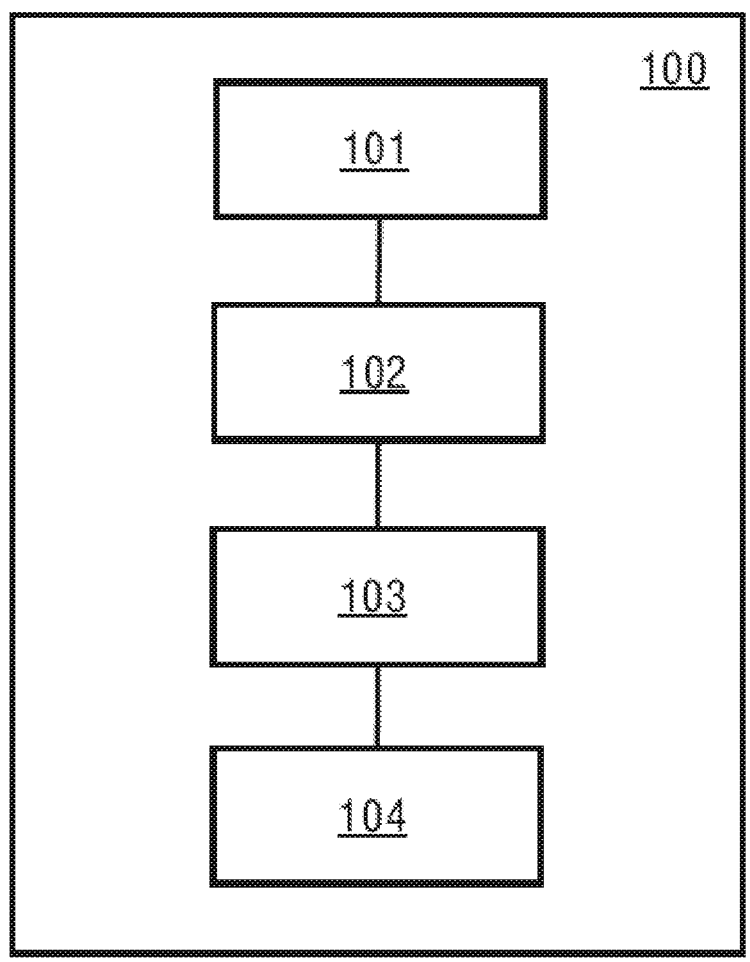
FIG. 2 is a structural diagram of a model generation apparatus 100 for generating a visual model layout of a space according to an embodiment of the present invention.

See FIG. 1 and FIG. 2. FIG. 1 is a flowchart of a method for generating a visual model layout of a space according to an embodiment of the present invention. The method is performed by the model generation apparatus 100. FIG. 2 is a schematic diagram of a model generation apparatus 100 for generating a visual model layout of a space according to an embodiment of the present invention.

The model generation apparatus 100 is configured to generate a visual model corresponding to a space, which may be implemented by hardware such as an integrated circuit, a field-programmable gate array (FPGA), or implemented by software configured in a device, for example, a computer, or implemented as a plug-in in existing software. The computer device can comprise a server device or a user device.

The model generation apparatus 100 comprises: a first obtaining unit 101, configured to obtain station layout information and station description information that correspond to the space, wherein the space comprises at least one station; a first determining unit (102), configured to, based on the station layout information and the station description information, determine station attribute information respectively corresponding to each station of the at least one station; a second determining unit (103), configured to respectively determine code information and model templates of the stations according to the station attribute information of the stations; and a first generation unit (104), configured to, based on the code information and the model templates that correspond to the stations, draw model images corresponding to the stations to generate a visual model layout corresponding to the space.

A method according to an embodiment of the present invention specifically comprises the following steps.

S101: By a first obtaining unit 101 in a model generation apparatus 100, obtain station layout information and station description information corresponding to a space (which may be a workshop in an embodiment of the present invention).

Here, a space according to an embodiment of the present invention refers to a place that can include a plurality of stations for performing activities such as production and sales, for example, a factory workshop, shopping mall, supermarket, or the like. Among them, a station refers to the basic unit in production, sales, and other activities in a space, and each station is used to complete a certain function or achieve a certain production purpose. For example, in a workshop, stations are used to implement production processes, such as part assembly and material injection. As another example, in a large supermarket, stations are used to implement functions such as merchandise display and money collection. Stations include devices, production materials, etc. for achieving the corresponding functions or processes. Preferably, stations also include staff, auxiliary materials, etc. for assisting in achieving the corresponding functions or processes.

In an embodiment of the present invention, the workshop space of a factory is mainly taken as an example, and those of ordinary skill in the art should understand that the examples in the Specification are only for making the solution clearer, but not for limiting the solution.

Station layout information is used to indicate the layout of each station in a space area. Preferably, the station layout information comprises at least one of the following:

1) Names of each station in the space area;
2) Coordinate information of each station in the space area;
3) Size information of each station in the space area.

Preferably, the station layout information is in the form of a 2D CAD document.

Figure 3:
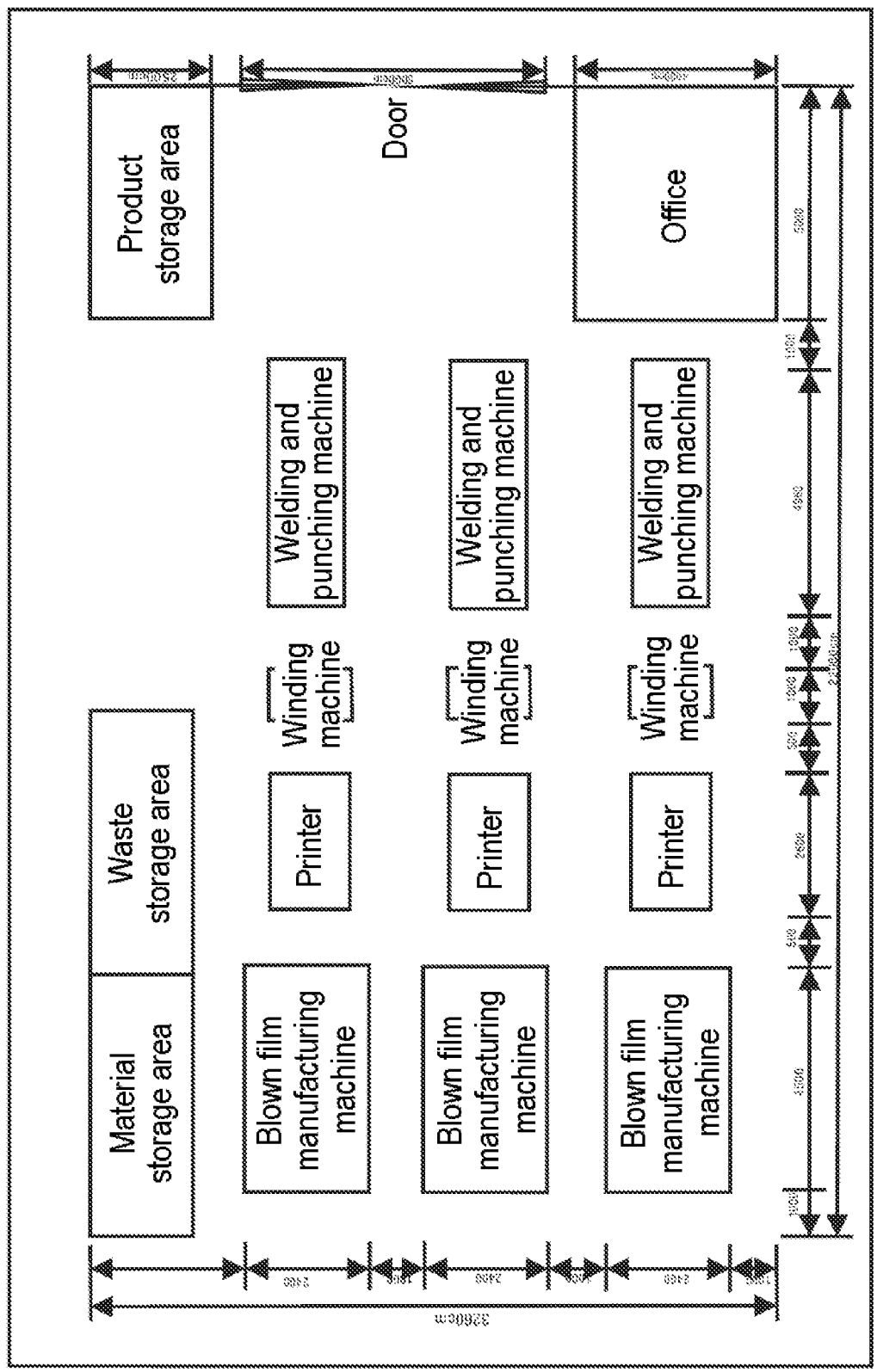
FIG. 3 is a schematic view of a 2D layout diagram according to an embodiment of the present invention.

See FIG. 3. FIG. 3 shows a schematic diagram of a station layout document in the form of 2D CAD, which is an example of a document for station layout information that can be employed in an embodiment of the present invention. In this document, the size information of the interior of the production space is marked around the figure; in addition, the names of each station and the position information of the stations in the space area are provided.

For example, based on the station layout information shown in FIG. 3, it can be understood that the space area comprises the following stations: a material storage area, a waste storage area, a blown film manufacturing machine, a printer, a winding machine, a welding and punching machine, a product storage area, and an office. In addition, depending on the size information marked in the surrounding area, the size and position information of each station can be read. For example, the distances from the blown film manufacturing machine to the walls on both sides are both 1000 cm, the machine measures 2400 cm×4500 cm, and the spacing between the blown film manufacturing machine and the printer is 500 cm; details are not described herein again.

The station description information according to an embodiment of the present invention at least comprises the type information of a station.

The type information includes, but is not limited to, at least one of the following:

1) Process type, for example, the single process type, that is, a station type that achieves only one process at a time, and the parallel process type, that is, a station type that achieves two or more processes simultaneously at a time;
2) Type of production line position, for example, source position type, drain position type, and the like.

More preferably, the station description information further comprises at least one piece of the following information:

1) Station name;
2) Area of the station;
3) Process time of the station, i.e., the processing time of the product on the station;
4) Process treatment method, i.e., whether the station adopts automatic treatment or manual treatment;
5) Name of the previous station and/or the next station, wherein the previous station comprises the station corresponding to the previous process on the production line, and the next station comprises the station corresponding to the next process on the production line.

Those of ordinary skill in the art should understand that other information related to the station may also be included in the station description document, and details are not described herein again.

Preferably, the station description information may be stored in a text format, for example, txt, Excel, or the like, or a text format recognizable by another model generation apparatus, for example, text written in a specific programming language.

The station layout information and the station description information may be stored locally on a computer device for implementing the model generation apparatus 100, or may be located on another device that communicates with a computer device for implementing the model generation apparatus, or on a storage device that can be read by the computer device.

Specifically, the first obtaining unit 101 may obtain station layout information and station description information from the corresponding storage location based on the layout information of the default setting and the storage address of the station description information, or the storage address input or selected by the user. For example, the first obtaining unit 101 can provide a user interface for importing different documents (which can be displayed on a user's display or on the screen of a mobile device), wherein the user can use the user interface to import the station layout information of the station space area of a workshop by selecting the storage path of the 2D CAD file corresponding to the station layout information. Similarly, station description information can be imported by selecting the storage address of the component station description information document. Information-related documents can be used to import the corresponding station layout information and station description information.

Further, in step S102, by the first determining unit 102 in the model generation apparatus 100, the station attribute information corresponding to each of the at least one station is determined on the basis of the station layout information and the station description information, wherein the station attribute information comprises the type information of the station.

The station attribute information comprises all the component-related information in the station layout information and the station description information.

Specifically, the first determining unit 102 extracts data based on respective document type of the station layout information and the station description information, and integrates the extracted data based on the station name to determine the station attribute information of each station. The first determining unit 102 may extract data in different manners from documents of different formats. For example, the model generation apparatus 100 may utilize an extraction module that comes with a CAD document to extract data in the CAD document. As another example, a function in an Excel document may be utilized to extract data from the Excel document; alternatively, the first determining unit 102 may extract data etc. in various types of documents based on pre-written script information, for example, extracting data in a txt file by executing a pre-written script.

Subsequently, the first determining unit 102 performs integration based on the extracted data of the respective stations to determine attribute information of the respective stations.

Since station description information comprises at least the type information of the station, it is obvious that the obtained station attribute information also comprises the type information of the station.

Further, in step S103, by the second determining unit 103 of the model generation apparatus, the code information and the model template corresponding to the station are respectively determined according to the station attribute information of each of the stations.

The second determining unit (103) further comprises: a first query unit (not shown) configured to, based on station attribute information of the stations, query a code library to obtain a corresponding source code segment; and a second obtaining unit (not shown) configured to assign values to parameters in the source code segment based on the station attribute information of the stations, to obtain the code information corresponding to the stations.

The code library comprises a plurality of source code segments, each source code segment corresponding to one type of station, and having parameter information corresponding to the station attribute information of the type.

Further, the second determining unit (103) further comprises: a second query unit (not shown) configured to, based on the station attribute information of the station, query a model library to obtain the model template for this station.

The model library comprises a plurality of model templates, and each model template corresponds to one type of stations. The model template may be a two-dimensional image or a three-dimensional image.

It should be understood by those of ordinary skill in the art that the code library and the model library may be included in the local device where the model generation apparatus is located, or may be included in another device capable of establishing communication with the model generation apparatus, and are obtained by the model generation apparatus by communicating with other devices.

Code information corresponding to the station is obtained by assigning values to the corresponding parameters in the source code segment by using the station attribute information of the station. Preferably, the code information, when executed, determines a drawing attribute corresponding to the model template of the station based on the values of the parameters for drawing a model image of the corresponding station.

Further, in step S104, by using a first generation unit 104 of the model generation apparatus 100, based on the code information corresponding to each station, model images corresponding to each station are determined to generate a visual model layout corresponding to the space.

A model image refers to an image obtained by adjusting a model template by using a drawing attribute, wherein the drawing attribute is determined on the basis of the values of each parameter in the code information of the corresponding station.

Specifically, the first generation unit 104 generates a script corresponding to the space based on the code information corresponding to each station and, by executing the script, uses the parameter values in the code information of each station in the script to determine the drawing attribute used to adjust the template model, thereby obtaining a model image of the station itself and drawing it to finally generate a visual model layout corresponding to the space.

For example, based on the location and size information of the station, the position and size of the model image are determined. As another example, based on the attribute information of a manual operation corresponding to the station, the fact that the model image corresponding to the station should be an image that includes operators is further determined. As yet another example, based on this attribute of the previous station/next station corresponding to the station, the order of drawing the model images of each station is determined.

Figure 4:
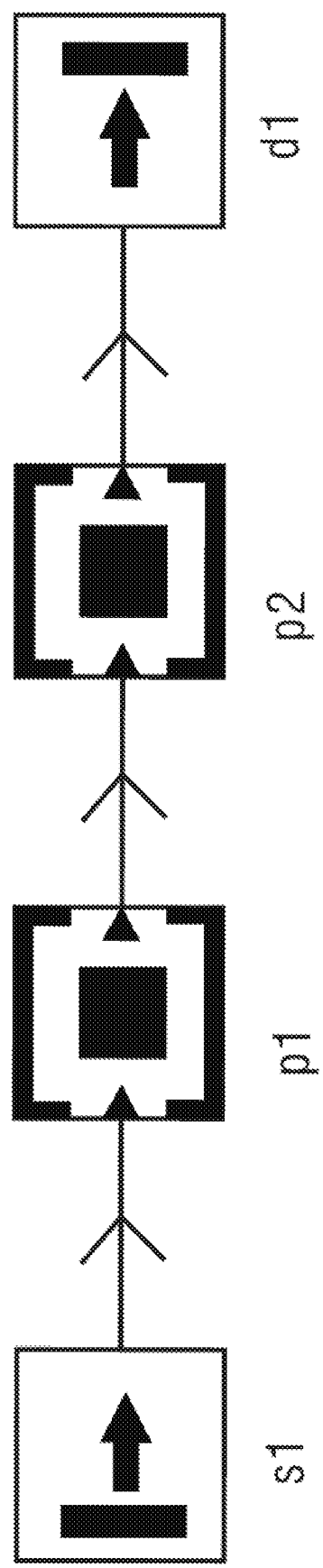
FIG. 4 shows a 2D visual layout model according to an embodiment of the present invention.

An embodiment according to the present invention is described below with reference to FIG. 4. The first obtaining unit 101 of the model generation apparatus 100 imports station layout information and station description information corresponding to the space based on the storage path input by the user, and the information is integrated by the first determining unit 102 to obtain the station attribute information of each of the stations as listed in Table 1.

TABLE 1

| Station name | Type information | Coordinate | Manual/ Automatic | Process time | Previous component |
|---|---|---|---|---|---|
| s1 | Source | (240, 350) | / | / | None |
| p1 | Single Process | (300, 350) | Automatic | 2 seconds | s1 |
| p2 | Parallel Process | (360, 350) | Manual | 2 seconds | p1 |
| d1 | Drain | (420, 350) | / | / | p2 |

It can be seen from Table 1 that there are currently four stations: s1, p1, p2 and d1, and the station attribute information corresponding to each station includes: type information from the station description information, processing method, process time, previous component information, as well as the coordinate information from the station layout information.

Next, the second determining unit 103 queries the code library based on the station types of each station to obtain source code segments corresponding to the respective stations, and uses respective station attribute information to assign values to each of the corresponding source code segments, thereby obtaining respective code information. For example, for station s1 of the source type, after querying in the code library, it is determined that it corresponds to a function for creating a station of the source type, and values are assigned to the corresponding coordinate parameters in the creation function using the coordinate information (240, 350) of the station, thereby obtaining the code information of station s1. As another example, for station p1 of the single process type, after querying in the code library, it is determined that it corresponds to a function for creating a station of the single process type, and values are assigned to the corresponding coordinate parameters in the creation function using the coordinate information (300, 350) of the station; in addition, using the process time information "2s" of the station, values are assigned to the corresponding parameters for indicating the process time of the station. In addition, according to the information of the previous station s1 of the station, a value is assigned to the connection function indicating the connection order of the station to determine that the order of the stations is from s1 to p1, thereby determining the code information of station p1.

In addition, the second determining unit 103, based on the station type of the station, queries the model library to obtain model templates corresponding to each station (wherein the code library and the model library in the present embodiment are located in the storage device of the computer device on which the model generation apparatus 100 runs).

Next, the first generation unit 104 generates a model generation script based on the respective code information of s1, p1, p2, and d1, determines the model image of station s1 by executing the script, and draws the model image at the corresponding position of the space layout diagram. Similarly, the first generation unit 104 continues executing the script, thereby determining the model image of station p1, and draws the model image at the corresponding position until the model images of the four stations are all drawn. The final image obtained is shown in FIG. 4, which is a visual model layout of the space containing the four stations.

Further, according to a preferred embodiment of the present invention, the model generation apparatus 100 further comprises a third obtaining unit (not shown), which is configured to obtain a staff arrangement document corresponding to the space. In addition, the first determining unit (101) of the model generation apparatus 100 is further configured to determine the station attribute information of the stations according to the station layout information, the station description information, and the staff arrangement information, wherein the staff arrangement information comprises at least one of the following:
1) Number of staff members of the space;
2) Scheduling time of each staff member;
3) Stations to which each of the staff members respectively correspond.

The manner in which the model generation apparatus 100 obtains the staff arrangement information is similar to the manner in which the first obtaining unit 100 obtains station layout information and station description information, and details are not described herein again.

Figure 5:
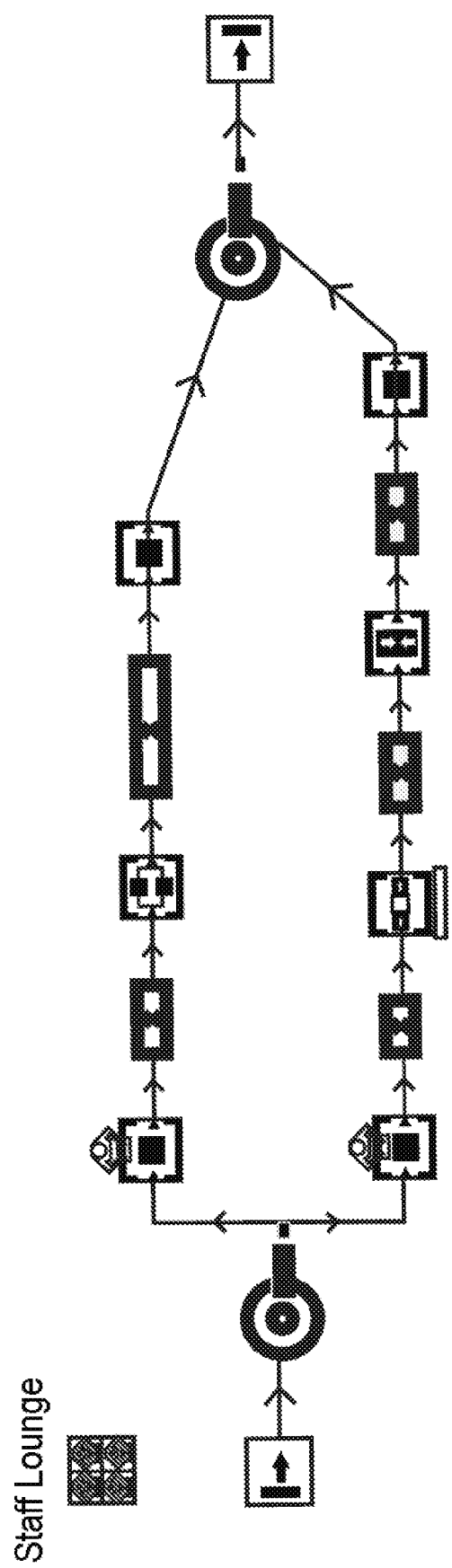
FIG. 5 shows a 2D visual layout model according to another embodiment of the present invention.
Figure 6:
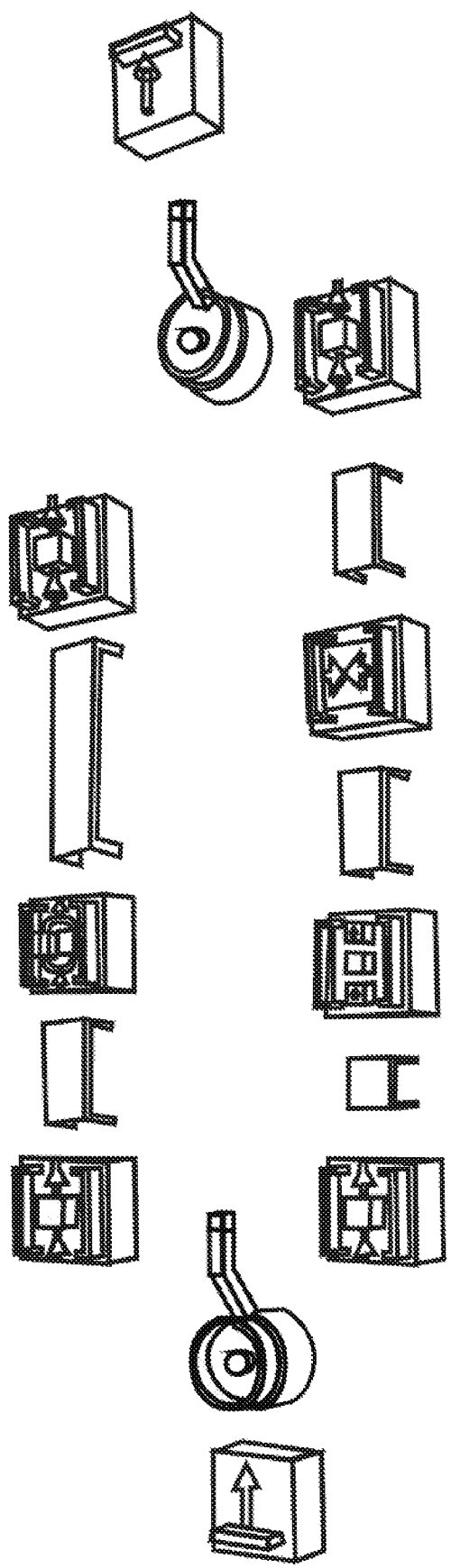
FIG. 6 shows a 3D visual layout model according to yet another embodiment of the present invention.

According to still another embodiment of the present invention, when station attribute information further comprises staff arrangement information, the model generation apparatus 100 may further reflect the corresponding staff arrangement information according to the corresponding source code and the model template. See FIGS. 5 and 6. FIG. 5 shows a 2D (two-dimensional) visual model layout according to an embodiment of the present invention, and FIG. 6 shows a 3D (three-dimensional) visual model layout according to an embodiment of the present invention.

"Staff Lounge" is shown in the top-left corner of FIG. 5, indicating the need for staff participation on the production line. The model generation apparatus presents two model images respectively having an employee identification in FIG. 5 according to the attribute information of the "manual operation station" of the station. FIG. 6 shows no station with staff participation. Therefore, there is no model image of the "Staff Lounge" in the space.

Each source code segment in the code library of an embodiment of the present invention can be implemented by using any programming language. More preferably, when the model generation apparatus 100 is included as a plug-in in a piece of software, the source code segments in the corresponding code library can be implemented on the basis of the programming language employed by the software.

According to a preferred embodiment of the present invention, the model generation apparatus 100 further comprises a receiving unit (not shown) and an update unit (not shown).

The receiving unit is configured to receive operation information of a user on the visual model layout.

The operation information includes operations such as an addition, modification, and deletion performed by a user on the visual model layout.

The operation information may be an operation directly performed by a user in the visual model layout, a selection operation by a user through a menu bar, or an operation by a user by inputting a corresponding instruction code.

Further, the update unit updates the visual model layout based on the modification operation.

For example, when the receiving unit receives operation information that the user drags the model image of a certain station Station_1 from A to B in the visual model layout, the update unit modifies the coordinate of the station Station_1 from cor_A to cor_B to match the drag operation, and displays the model image of the station Station_1 at B.

As another example, when the receiving unit receives the operation of the new station Station_2 selected by the user in the menu bar, and the attribute information such as the type information and location information of the station Station_2 input by the user, the update unit adds a model image corresponding to the type information of the station Station_2 at the corresponding position in the visual model layout.

As another example, when the receiving unit receives an operation by the user of selecting a component and pressing the Delete key, the update unit deletes the model image corresponding to the station in the visual model layout.

According to a preferred embodiment of the present embodiment, the model generation apparatus 100 according to the present embodiment further comprises a second generation unit (not shown).

The second generation unit, based on the updated visual model layout, generates a new layout document corresponding to the space.

Specifically, the second generation unit may, after receiving a user request instruction, generate new station layout information, or, when a change in the visual model layout is detected, automatically generate new station layout information.

Preferably, on detecting a change in the visual model layout, the second generation unit may prompt the user to decide whether it is necessary to generate new station layout information.

According to a method of an embodiment of the present invention, automatic generation of a factory model layout is achieved, the time and effort required for planning the model layout of a space are greatly reduced, and an engineer does not need to learn a new programming language and thus can spare more time for creative work. In addition, according to a solution of an embodiment of the present invention, a 2D layout diagram can be directly generated on the basis of a modified 3D model layout without separate modifications, so that the original layout map of the factory can be changed and modified more conveniently.

Figure 7:
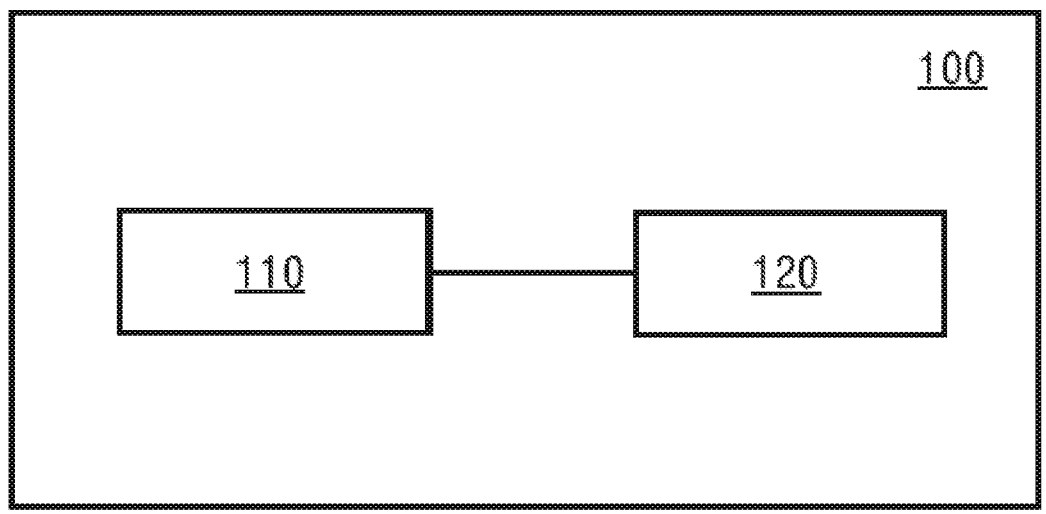
FIG. 7 is a general block diagram showing the hardware-implemented model generation apparatus 100 according to an embodiment of the present invention.

See FIG. 7, which shows a general block diagram of a hardware-implemented model generation apparatus according to an embodiment of the present invention. The model generation apparatus 100 can comprise a memory 110 and a processor 120. The memory 110 can store executable instructions. The processor 120 can implement the operations performed by the various units shown in FIG. 2 according to the executable instructions stored in the memory 110.

Furthermore, embodiments of the present invention also provide a machine-readable medium having stored thereon executable instructions that, when executed, cause a machine to implement operations performed by a model generation apparatus.

It should be noted that not all the steps and modules in the foregoing processes and the various structural diagrams are necessary, and some steps or modules may be omitted according to actual needs. The order of execution of each step is not fixed and can be adjusted as needed. Each module is functionally divided only for convenience of description. In actual implementation, one module can be implemented by multiple modules, and the functions of multiple modules can also be implemented by the same module. These modules can be located in the same apparatus and can also be located in different apparatuses.

The hardware modules in the various embodiments may be implemented mechanically or electronically. For example, a hardware module can comprise specially designed permanent circuits or logic devices (such as dedicated processors including FPGAs or ASICs) for performing specific operations. A hardware module may also comprise programmable logic devices or circuits (such as including general-purpose processors or other programmable processors) that are temporarily configured by software for performing particular operations. A hardware module can be implemented mechanically, or by using a dedicated permanent circuit, or by using temporarily configured circuits (for example, circuits configured by software), depending on cost and time considerations.

An embodiment of the present invention further provides a machine-readable storage medium storing instructions for causing a machine to perform a method as described herein. Specifically, a system or apparatus equipped with a storage medium can be provided; in the storage medium, a software program code for implementing the functions of any of the above embodiments is stored on the storage medium, and a computer (or CPU or MPU) of the system or apparatus is caused to read and execute the program code stored in the storage medium. In addition, some or all of the actual operations may be performed by an operating system or the like operating on a computer based on instructions of the program code. It is also possible to write a program code read from the storage medium into a memory configured on an expansion board inserted into the computer or into a memory configured on an extension unit connected to the computer; then, based on the instructions of the program code, a CPU, etc. installed on the expansion board or expansion unit are caused to perform some and all actual operations, thereby realizing the functions of any of the above embodiments.

Implementation modes of storage mediums for providing a program code include floppy disks, hard disks, magneto-optical disks, optical disks (such as CD-ROMs, CD-Rs, CD-RWs, DVD-ROMs, DVD-RAMs, DVD-RWs, DVD+RWs), tapes, non-volatile memory cards, and ROMs. Alternatively, a program code can be downloaded from a server computer on a communication network.

Those of ordinary skill in the art will appreciate that various modifications and changes can be made in the various embodiments disclosed herein without departing from the spirit of the present invention. Therefore, the scope of the present invention should be defined by the appended claims.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A method for generating a visual model layout of a space having, at least one station provided therein, the method comprising:
    obtaining an electronic file from a storage location, the electronic file including station layout information and station description information corresponding to the space;
    extracting data from the electronic file based on the station layout information and the station description information;
    integrating, based on at least the station description information, the data to obtain station attribute information corresponding to the at least one station;
    determining code information and model templates of the at least one station according to the station attribute information, the determining including
        querying, based on the station attribute information, a code library to obtain a corresponding source code segment,
        assigning values to parameters in the corresponding source code segment based on the station attribute information, to obtain the code information, and
        querying, based on the station attribute information, a model library to obtain the model templates; and
    generating a visual model layout corresponding to the space by drawing model images based on the code information and the model templates, the model images corresponding to the least one station, and the drawing including
        generating a script based on the code information, the script corresponding to the space,
        executing the script to determine a drawing attribute for adjusting a template model, the executing of the script using parameter values in the code information in the script to determine the drawing attribute, and adjusting the model template based on the drawing attribute.

2. The method of claim 1, wherein the station attribute information includes staff arrangement information of the at least one station.

3. The method of claim 1, further comprising:
receiving operation information of a user on the visual model layout; and
updating, the visual model layout based on the operation information.

4. The method of claim 3, further comprising:
generating, based on the updated visual model layout, new station layout information corresponding to the space.

5. A model generation apparatus for generating a visual model layout of a space including at least one station, the model generation apparatus comprising:
a first obtaining unit, configured to obtain an electronic file from a storage location, the electronic file including station layout information and station description information corresponding to the space;
a first determining unit, configured to
extract data from the electronic file based on the station layout information and the station description information, and
integrate, based on at least the station description information, the data to obtain station attribute information corresponding to the at least one station;
a second determining unit, configured to determine code information and model templates of the at least one station according to the station attribute information, the second determining unit including
a first querying unit configured to query, based on the station attribute information, a code library to obtain a corresponding source code segment,
a first assigning unit configured to assign values to parameters in the corresponding source code segment based on the station attribute information, to obtain the code information, and
a second querying unit configured to query, based on the station attribute information, a model library to obtain the model templates; and
a first generation unit configured to generate a visual model layout corresponding to the space by drawing model images based on the code information and the model templates, the model images corresponding to the at least one station, the first generation unit including
a first generation sub-unit configured to generate a script corresponding to the space based on the code information, and
a second generation sub-unit configured to
execute the script to determine a drawing attribute for adjusting a template model, wherein
by executing the script, the second generation sub-unit uses parameter values in the code information in the script to determine the drawing attribute, and
adjust the model template based on the drawing attribute.

6. The model generation apparatus of claim 5, wherein the station attribute information includes staff arrangement information.

7. The model generation apparatus of claim 5, further comprising:
a receiving unit, configured to receive operation information of a user on the visual model layout; and
an update unit configured to update the visual model layout based on the operation information.

8. The model generation apparatus of claim 7, further comprising:
a second generation unit, configured to, based on the updated visual model layout, generate new station layout information corresponding to the space.

9. A computer device, comprising:
the model generation apparatus of claim 5.

10. A computer device, comprising:
the model generation apparatus of claim 6.

11. A computer device, comprising:
the model generation apparatus of claim 7.

12. A model generation apparatus for generating a visual model layout of a space including at least one station, the model generation apparatus comprising:
a memory storing computer-readable instructions; and
one or more processors configured to execute the computer-readable instructions such that the one or more processors are configured to,
obtain an electronic file from a storage location, the electronic file including station layout information and station description information corresponding to the space,
extract data from the electronic file, based on the station layout information and the station description information,
integrate, based on at least the station description information, the data to obtain station attribute information corresponding to the at least one station,
determine code information and model templates of the at least one station by
querying, based on the station attribute information, a code library to obtain a corresponding source code segment,
assigning values to parameters in the corresponding source code segment based on the station attribute information, to obtain the code information, and
querying, based on the station attribute information, a model library to obtain the model templates, and
generate a visual model layout corresponding to the space by drawing model images, based on the code information and the model templates, the model images corresponding to the at least one station, and the drawing including
generating a script corresponding to the space based on the code information,
executing the script to determine a drawing attribute for adjusting a template model, the executing of the script using parameter values in the code information in the script to determine the drawing attribute, and
adjusting the model template based on the drawing attribute.

13. A non-transitory computer-readable medium storing executable instructions for carrying out the method of claim 1 when the executable instructions are executed on a computer.

14. A non-transitory computer-readable medium storing executable instructions for carrying out the method of claim 2 when the executable instructions are executed on a computer.

* * * * *